United States Patent [19]

Petric

[11] Patent Number: 5,635,719
[45] Date of Patent: Jun. 3, 1997

[54] VARIABLE CURVILINEAR AXIS DEFLECTION MEANS FOR PARTICLE OPTICAL LENSES

[75] Inventor: Paul F. Petric, Brewster, N.Y.

[73] Assignee: International Business Machines Corporation, Armonk, N.Y.

[21] Appl. No.: 685,278

[22] Filed: Jul. 23, 1996

[51] Int. Cl.[6] .................................................. H01J 37/147
[52] U.S. Cl. ............................... 250/396 ML; 250/492.23
[58] Field of Search ...................... 250/396 ML, 396 R, 250/398, 492.23, 492.2; 315/370; 313/437, 442

[56] References Cited

U.S. PATENT DOCUMENTS

| | | | |
|---|---|---|---|
| 4,162,403 | 7/1979 | Baumgarten | 250/396 ML |
| 4,376,249 | 3/1983 | Pfeiffer et al. | 250/396 ML |
| 4,544,846 | 10/1985 | Langner et al. | 250/396 ML |
| 4,577,111 | 3/1986 | Saitou et al. | 250/492.2 |
| 4,859,856 | 8/1989 | Groves et al. | 250/398 |
| 4,912,405 | 3/1990 | Richardson | 324/158 R |
| 4,977,324 | 12/1990 | Kruit et al. | 250/396 ML |
| 5,285,074 | 2/1994 | Haire et al. | 250/396 ML |
| 5,466,904 | 11/1995 | Pfeiffer et al. | 219/121.25 |
| 5,481,164 | 1/1996 | Langner et al. | 250/396 ML |

FOREIGN PATENT DOCUMENTS

58-5955A   1/1983   Japan .

*Primary Examiner*—Jack I. Berman
*Assistant Examiner*—Kiet T. Nguyen

[57] ABSTRACT

An improved particle lens has an axis which is shifted to follow the central ray as it is deflected through the lens creating, in effect, a variable curvilinear optical axis for the lens. The variable curvilinear optical axis is created for the lens so that the axis varies proportionally to the magnitude of the beam deflection. The optical axis of the lens is shifted by applying a uniform field to the lens to cancel the first term of the radial field with a function that is dependent on the position along the z-axis. This function is the trajectory of the central ray of the electron beam.

16 Claims, 4 Drawing Sheets

VARIABLE CURVILINEAR AXIS DEFLECTION MEANS FOR PARTICLE OPTICAL LENSES

BACKGROUND OF THE INVENTION

1. Field of the Invention

The present invention generally relates to particle optical lenses, such as electron beam lenses, and more particularly, to a variable curvilinear optical axis for such lenses to correct for aberrations.

2. Description of the Prior Art

In light optics, it is possible to maintain low aberrations and distortions while utilizing a significant portion of the lens area for imaging. In electron optics, however, it is not practical to correct the field of a lens to the same extent as with light optics. This is because the electron optical lens is actually a magnetic field rather than a piece of optical glass, and it is not possible to shape the magnetic field to any desired shape or to the same precision that a piece of glass can be formed. The magnetic field must, after all, satisfy LaPlace's equation within the lens. This problem is typically overcome in electron optics by making the lens as large as possible, or practical, relative to the optical field of view while keeping the focal length as short as practical for the given application. Making the lens large relative to the application has the effect of approximating the field shape of an "ideal" lens, much the same as is done in light optics when a small portion of a large spherical surface is used to approximate a parabolic surface. With probe forming systems, this means staying as close to the lens center or optical axis as the off-axis distortions and aberrations will allow. It is usually the case that the on-axis lens errors are smaller than the off-axis errors and that the off-axis errors increase with the square or cube of the distance off axis. If higher order error terms are considered, than the errors will increase as the higher powers of the terms.

It is possible to deflect an electron beam at very high speeds either electrostatically or magnetically or a combination of both. Thus, any point can be addressed within a relatively large deflection field in very short times (on the order of microseconds or even nanoseconds). The final location of the beam can also be corrected during deflection by modifying the deflection address according to some predetermined distortion map acquired during system calibration and/or wafer registration. This is a common practice, but it only corrects the landing position of a single ray or small bundle of rays defining a point which is transferred from the object plane to the image plane. Any lens errors will still distort the local region about this central ray. A common practice to correct some of this local image distortion is to refocus and apply a stigmation correction to the off axis beam. The further the beam is deflected off the central axis, the greater the deflection aberrations will become. At some point, further deflection is rendered unusable due to excessive lens aberrations that are not correctable by methods known in the art. The inventions disclosed in U.S. Pat. No. 4,859,856 for a Variable Axis Lens (VAL) and U.S. Pat. No. 4,544,846 for Variable Axis Immersion Lens (VAIL) used a technique of subtracting a planar field from the lens' radial field. This planar field is everywhere parallel to the radius connecting the central z-axis and the point to which the beam is deflected. The term "planar" is used to refer to a field, such as that resulting from a deflection yoke (typically of either a Saddle or Toroidal configuration) where the field in any z plane is uniform, but the magnitude of the field may vary according to a smooth function of z as one moves from z-plane to z-plane. As described in the above inventions, the strength of the planar field subtracted from the lens radial field is proportional to the first derivative with respect to axial position, z, and to the distance the lens field is to be shifted in the radial direction. The typical method of applying the planar field is by means of a deflection yoke sized and positioned to match the negative of the first term of the radial field of the lens. This has the effect of shifting the optical axis laterally with the deflected beam so that to the beam it appears as though it is still on the optical axis. By this method, the off-axis errors of the lens and deflection system can be greatly reduced.

This technique is not a perfect solution because it corrects only to the first order, which is the greatest part of the errors; however, this approach also assumes that the effective axis of the lens remains a nearly straight line shifted parallel to the geometric axis of the lens. The electron beam is deflected prior to entering the field of the lens such that the beam ends up traveling coincident to the shifted axis as it travels through the lens. This is done so that the electron beam does not deviate substantially from the shifted axis and therefore does not incur any errors greater than is allowed by the system error budget. Such an approach requires a considerable spacing between lenses and deflection yokes; however, in a practical system design, some overlap of the beam deflection and lens will occur.

The separation of the lens and beam deflection yokes cannot increase without penalty. The longer the path length of the electrons, the more Coulomb interaction between electrons will occur. As a result of the Coulomb interaction it would therefore be desirable for the beam deflection and lens to be "fully" overlapped in order to keep the optical path length that the electron travels to a minimum. This Coulomb interaction creates additional errors which add to the lens and deflection errors.

The problem, therefore, is how to achieve the largest electron optical field of deflection with the smallest errors possible in the shortest optical path length possible.

SUMMARY OF THE INVENTION

It is an object of the present invention to provide an improved particle lens and beam deflection means in which the axis of the lens is shifted as a function of the position along the beam path so as to follow the central ray of the beam as it is deflected through the lens creating, in effect, a variable curvilinear optical axis for the lens.

According to the invention, there is provided an electron optical lens and deflection means having a variable curvilinear optical axis that varies in its position relative to the central lens axis so as to follow the predetermined path of the deflected electron beam. This is accomplished by applying a planar field to the lens to cancel the first term of the radial field with a function that is dependent on the position along the z-axis. This function is the trajectory of the central ray of the electron beam.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

An electron optical lens, typically used in probe forming and projection imaging systems, is a magnetic axial symmetric lens. The description of the preferred embodiment of the invention will be in the context of this type of lens and imaging system, although the concept may be applied to other and different embodiments of the invention.

Figure 4:
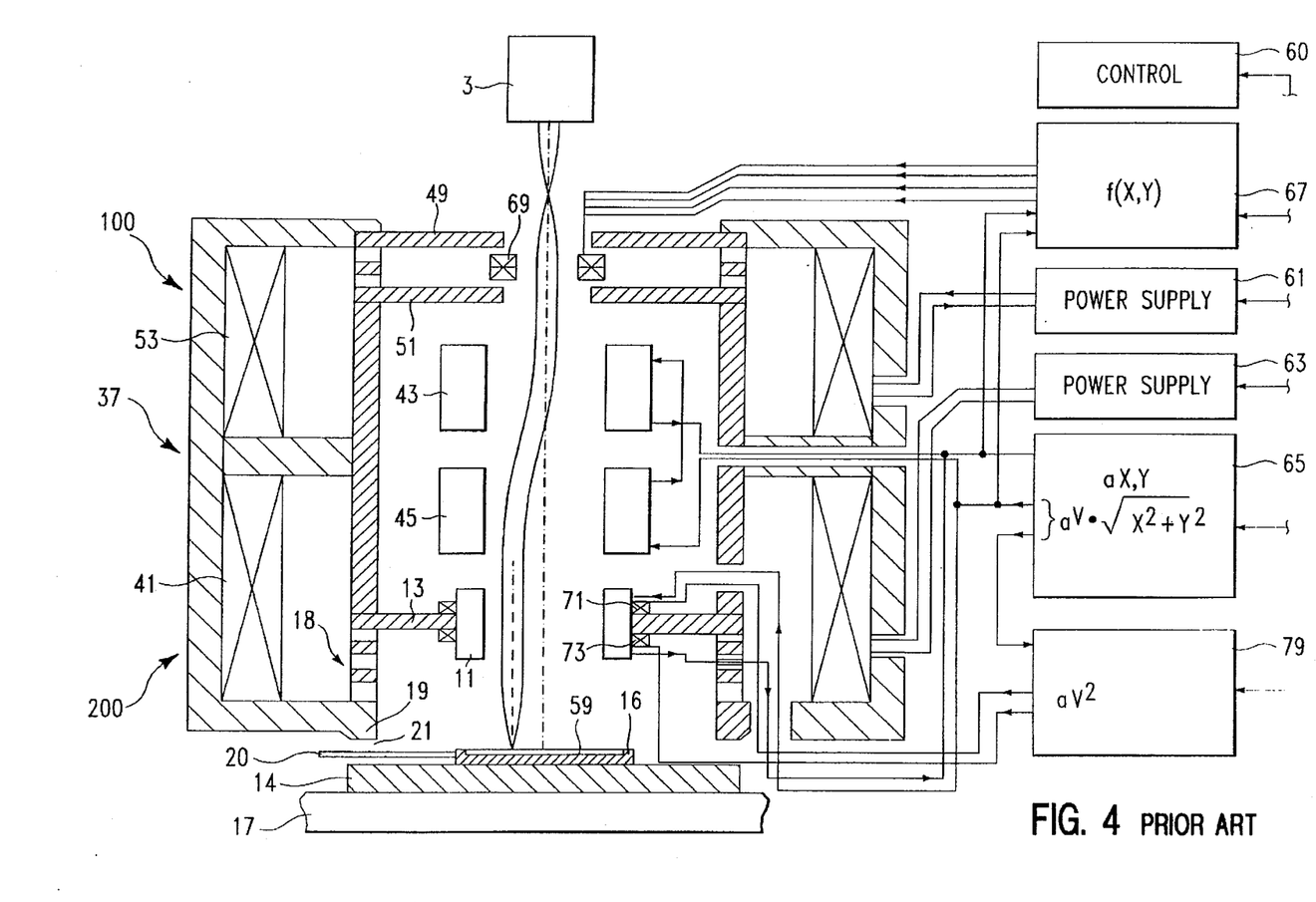
FIG. 4 is a drawing illustrating in partially pictorial, partially schematic form a variable axis lens electron beam system according to the prior art.

Referring now to the drawings, and more particularly to FIG. 4, there is shown a portion of a variable axis lens electron beam projection system of the type disclosed in U.S. Pat. No. 4,544,846. A Variable Axis Immersion Lens (VAIL) is used as an example for illustration. However, the general Variable Axis Lens (VAL) can equally be used as an example (U.S. Pat. No. 4,376,249). The VAIL was chosen for simplicity because the VAIL is one half of a VAL. At the top of the Figure, a box 3 denotes schematically an initial portion of the system that generates an electron beam travelling downward in the Figure, initially centered on the system or physical axis 101 of the hardware, which is also the z axis of the coordinate system. Box 3 may be an electron gun, in the case of a probe forming system; or it may be the upper portion of a projection imaging system that passes the beam through a reticle in order to transfer the reticle "pattern" by means of the electron beam to a target wafer. The portion of the optical system shown in FIG. 4 collimates the beam emerging from box 3 and brings the beam to a focus on wafer or target 59 at x and y positions that are controlled by controller means illustrated schematically on the right of the figure. A general purpose computer or dedicated controller 60 sends signals to power supplies 61 and 63 and signal generators 65, 67 and 79, all collectively referred to as control means. The optical system includes a magnetic lens 100, extending a lens length along axis 101 and having pole pieces 49 and 51. Lens 100 includes an excitation coil 53 for applying a magnetic focussing field through pole pieces 49 and 51, collectively referred to as field generating means, providing telecentric capability, as is known in the art. Dynamic focus correction coil 69 is conventionally used as required by system tolerances to provide higher-order corrections (proportional to $r^2$, etc.) to lens 100.

A pair of magnetic deflection yokes 43 and 45 predeflect the projected electron beam, under control of the controller means, before it enters variable axis lens 200 in the lower portion of the figure to direct it at the desired x and y coordinates on wafer 59. In one example, such a system can be used to fabricate a reticle by scanning across the surface of the reticle and exposing the reticle pattern. Such a system can also be used for direct writing on a wafer without the use of a reticle.

Variable axis immersion lens 200, in the lower portion of FIG. 4, includes an upper pole piece 13 and a lower pole piece 14. Excitation coil 41 activates immersion lens 200 and produces magnetic field lines that run from upper pole piece 13, having a non-zero bore that permits passage of the beam, to lower pole piece 14. A leg 18 of the immersion lens magnetic circuit includes alternating magnetic and non-magnetic sections so as to shield metal parts of lens 200 from changing yoke fields while at the same time preventing the magnetic lines of force of the lens from being short-circuited. The magnetic circuit is also shaped at section 19 of the lower pole piece to permit flux to pass to zero bore section 14 with minimal reluctance and fringing. A single magnetic compensation yoke 11 provides a magnetic field that is proportional to the first derivative of the axial magnetic field produced by immersion lens 200. Yoke 11 and its associated signal or current generator may be referred to as axis shifting means.

FIG. 4 also illustrates the target holding, handling, and stepping stage. Target 59 is mounted to a target holder 16 for providing accurate registration of the target within the electron beam projection system. A target handler arm 20 inserts the target into lens 200. A target stepper table 17 is employed for x-y movement of the target. Since the magnetic projection field produced by upper pole piece 13, lower pole piece section 14 and excitation coil 41 has zero slope in the vicinity of the target area, the compensation field produced by compensation yoke 11 has zero field strength in the vicinity of the target area. Accordingly, no eddy currents are generated by compensation yoke 11 in or around the target area.

Astigmatism and field curvature are corrected using dynamic correction. As shown in FIG. 4, a power supply 61 is connected to excitation coil 53, and a power supply 63 is connected to excitation coil 41. A computer controlled driver 65 supplies excitation signals to deflection yokes 43 and 45. Deflection yokes 43 and 45 have two sets of magnetic coils that cooperate to generate a magnetic field in the x-y plane, perpendicular to axis 101, to deflect the electron beam in both an x and a y direction. Deflection yokes 43 and 45 are typically comprised of a plurality of yokes of saddle or toroidal configuration. Driver 65 also activates magnetic compensation yoke 11 which consists of a pair of x-y magnetic deflection yokes. Magnetic compensation yoke 11 may comprise a simple saddle coil because of its smaller outside diameter as compared to a toroidal yoke of the same deflection sensitivity. The x-y current sent to magnetic compensation yoke 11 is proportional to the x-y currents sent to deflection yokes 43 and 45 and may be supplied by the same driver 65. A driver 79 connected to dynamic focus correction coils 71 and 73 receives an input signal which is proportional to r, the deflection distance of the shifted axis, and generates a signal proportional to $r^2$.

In the first approximation, the field of the axis-shifting yoke 11 compensates the radial component of the lens 200 field along a line parallel to the symmetry axis of the lens and having an x-y position proportional to the current into the compensation yoke. This line represents the shifted electron optical axis because the radial component of the field has become zero there.

In operation, yokes 43 and 45 will be driven to steer the beam to selected points on wafer 59. Compensating coil 11 will be driven to center the optical axis of lens 200 above the desired position on the wafer.

The magnetic field of an axially symmetric lens can be uniquely described anywhere inside the lens by the distribution of the magnetic flux density on the axis of the lens. The normal lens axis 101 defined by the mechanical center of the lens will also be referred to as the system axis and the shifted or variable axis will be referred to as the "variable axis". The radial component (designated $B_r$) of the field anywhere in the lens is described by the infinite series $$B_r(r,z) = \sum_{n=1}^{\infty} \left(\frac{r}{2}\right)^{(2n-1)} \frac{(-1)^n \frac{d^{(2n-1)}}{dz^{(2n-1)}} B(z)}{n!(n-1)!} \quad (1)$$

where z is the position along the system axis. On the axis, r=0 and therefore, $B_r$=0. If $B_r(r,z)$ is set equal to zero at some non-zero r by setting all the terms of Equation (1) equal to zero, then the axis of the lens is shifted to this new location of r. The series of the Equation (1) converges very rapidly, and the first term is the dominant term of the series. The first term of this series is $$B_r(r,z) = -\left(\frac{r}{2}\right)\frac{d}{dz} B(z) \quad (2)$$

Thus, if this first term is set equal to zero at a specific value of r by adding a planar field in the direction of r that is of equal magnitude to Equation (2) for the given value of r but of opposite sign, then in effect the axis of the lens is shifted magnetically to this new location of r. In the prior art variable axis electron optical lens system as shown in FIG. 4, the value of r is constant, thus shifting the axis laterally as a straight line parallel to the original axis. This planar field is easily approximated very well by a typical deflection yoke field.

When the electron beam has been deflected prior to entering the imaging lens 200, so that the beam is travelling parallel to the system axis, then the electrons entering on the shifted axis will continue on this axis traveling in a straight line. This deflection prior to the lens is not easy to achieve in practice because the deflection magnetic field and the lens magnetic field do not end abruptly but, rather, taper to a small value over relatively large distances and it is not practical to space the deflection coils far enough away that the fields do not overlap. The more the overlap, the more the electron beam will be off the variable axis through a longer portion of the lens. As the overlap increases, the lens and deflection errors also increase. Thus, as a given system is made more compact, the error reduction benefits of using a variable axis lens become vanishingly small.

Figure 2:
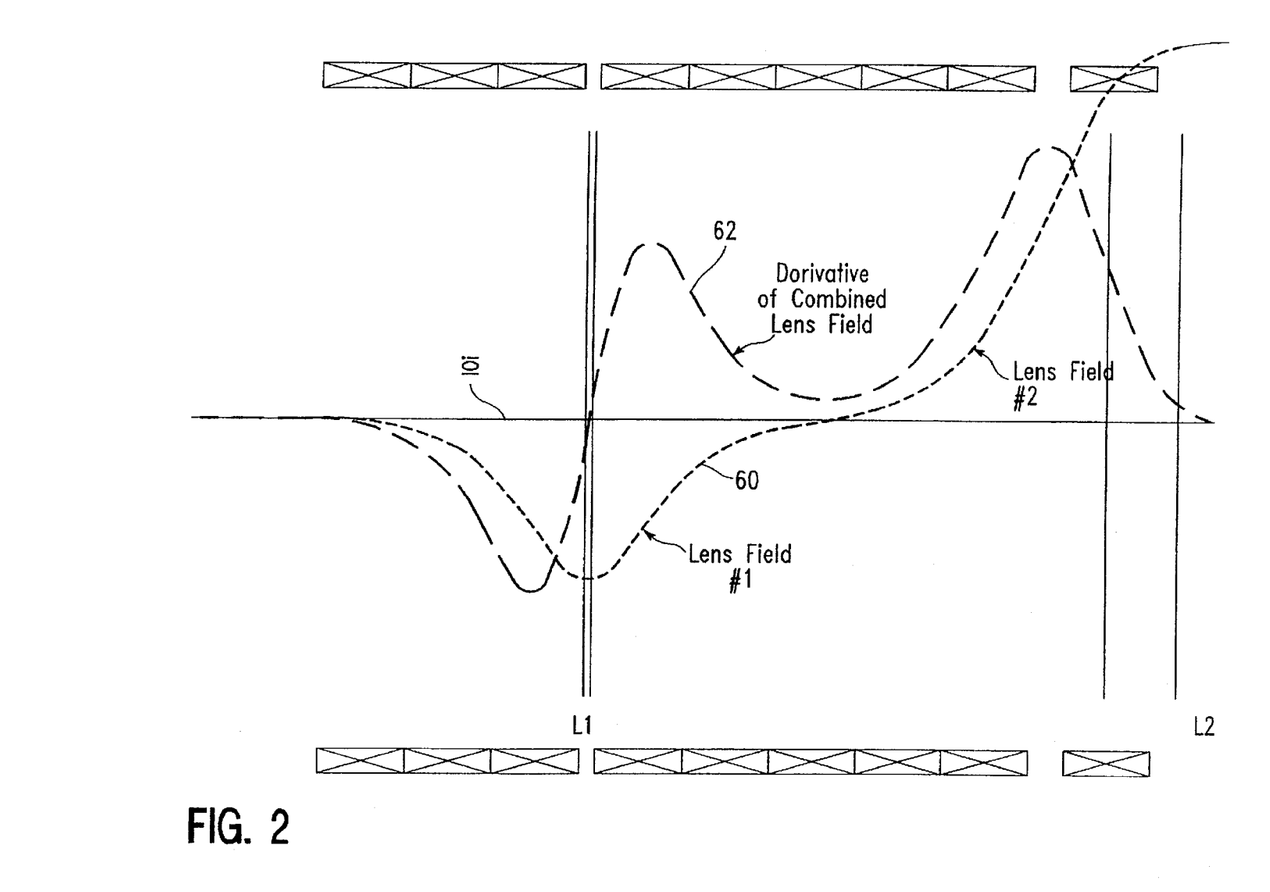
FIG. 2 is a schematic cross-sectional view of an electron optical lens showing as a solid line the axial flux density of the lens and as a dashed line the first derivative with respect to z.

The present invention addresses the problem caused by the overlap, by making the shifted axis curvilinear, rather than straight. This is achieved by applying the planar correction field to the lens field in order to cancel the first term of the radial component of the lens field using a non-constant function of the z-position, R(z), in Equation (2) instead of the constant term, r. This function is the r-coordinate of the trajectory of the central ray of the electron beam. Referring now to FIG. 2, two curves are displayed to illustrate the relationship of the lens field and its derivative in a multi-lens system. The solid line 60 in FIG. 2 is the combined axial flux density of the lenses, peaking at L1, the center of lens 1 and again at L2, the center of lens 2. The dashed line 62 is the first derivative of the field with respect to z. The boxes on the side of the Figure represent a set of coils for generating correction fields. It can readily be seen that the field of lens 2 penetrates within the volume defined by the coils of lens 1, i.e. the fields overlap. To use this lens as a variable curvilinear axis lens system according to this invention, a planar field from a deflection yoke that varies in magnitude along the z-axis, proportional to the dashed curve is superimposed onto the lens magnetic field. The function R(z) is proportional to the radial coordinate of the trajectory of the central ray of the electron beam. Thus the magnetic axis of the variable curvilinear axis lens is made to follow the central electron trajectory of the electron beam. The physical implementation of the z-dependence is effected by the use of a plurality of compensation yokes of the same type as coil 11 in FIG. 4 to provide a contigually smooth displacement of the variable axis so as to follow the beam trajectory. The greater the number of compensation yokes, the better the approximation to produce the magnetic field which establishes the desired curvilinear axis.

Figure 1:
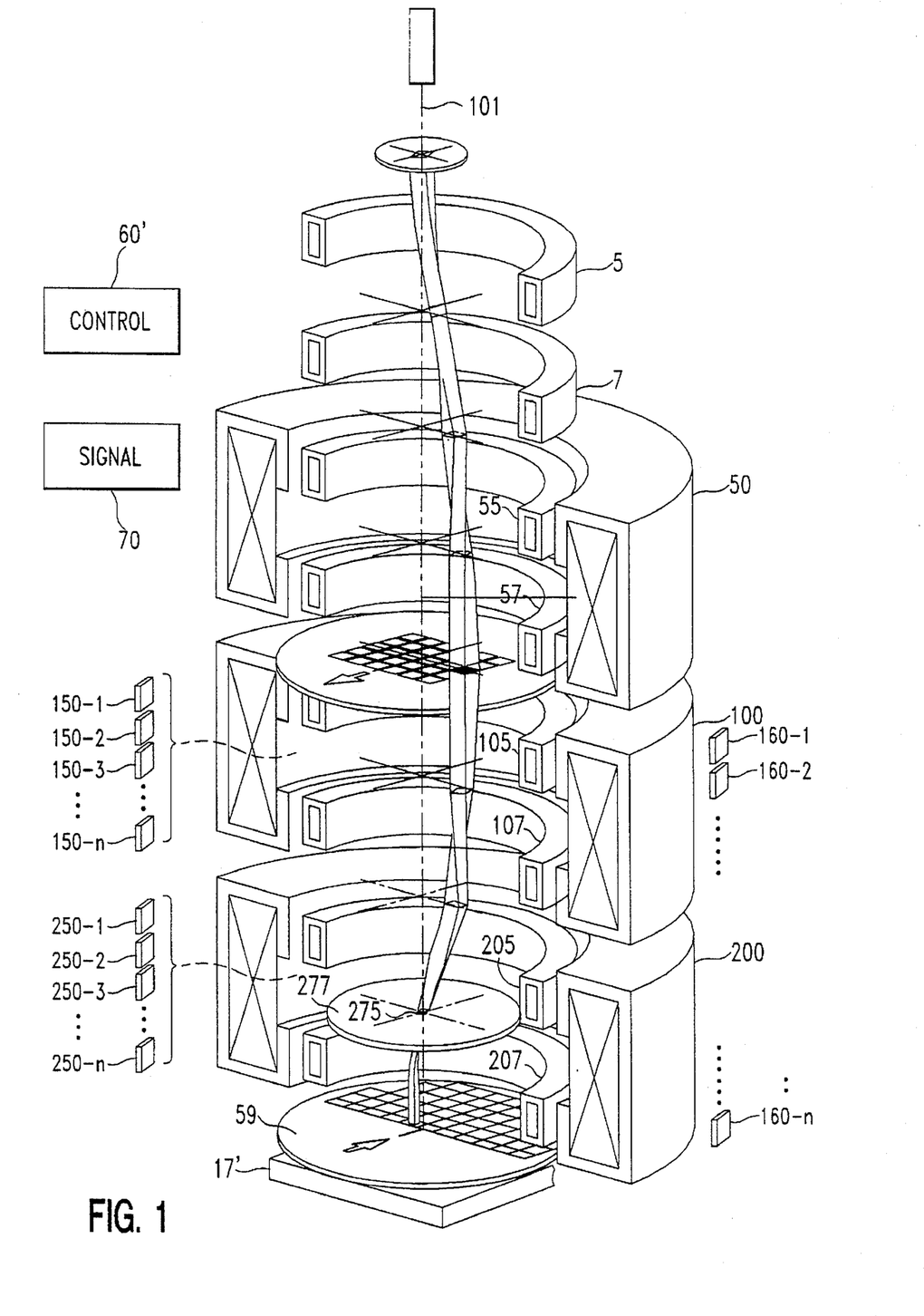
FIG. 1 is a detailed schematic drawing illustrating a variable axis lens electron beam system on which the invention is implemented.

Referring now to FIG. 1, there is shown in partially pictorial, partially schematic form a projection electron beam system employing the present invention, the bottom portion of which corresponds to FIG. 4. The invention applies to any deflection lens system, such as a probe-forming system, a shaped-beam system, or a scanning electron microscope. The projection system is chosen merely as an example and also because it requires the most demanding image fidelity over a large field of view, not just a probe or a small shaped spot. At the top of the figure, box 1 represents schematically the electron gun that generates a slightly diverging beam, having an energy of illustratively 100 keV and travelling along the z-axis 101. Controller 60' and signal generator 70, analagous to boxes 61, 63, 65, 67 and 79 of FIG. 4, perform similar functions of controlling lens coils and deflectors. Deflectors 5 and 7 are used together as is known in the art to deflect the beam so that the extrapolated intersection point of the beam trajectory with the z-axis 101 is located between the two yokes 5 and 7. This point is the conjugate image point of aperture 275 discussed below. The current in yokes 5 and 7 are nearly equal and are adjusted during system setup so that no lateral motion of the beam is observed at aperture 275, thereby decreasing the variation of beam current impinging the target wafer 59. Variations of beam current of less than 1% can produce intolerable critical dimension errors within the circuit pattern transferred from the reticle to the wafer. The combination of deflectors 5, 7, 55 and 57 is set as is known in the art to illuminate the nth subfield of reticle 375 with a shaped beam that impinges the reticle plane with nearly perpendicular landing.

Reticle 375 represents the pattern on a layer of an integrated circuit and is divided into subfields, illustratively on the order of 1 mm on a side and carrying the pattern that is to be imaged on wafer 59 at the bottom of the figure. The beam will step in sequence through the subfields on the reticle, the totality of which represents the pattern of the integrated circuit. Such a system is described in U.S. Pat. No. 5,466,904. Illumination lens 50, which may be a curvilinear axis lens according to the invention or a conventional variable axis lens, forms an image of the emitting surface of the electron source or cathode on the nth subfield by means of deflectors 5, 7, 55 and 57. This has the effect of illuminating the reticle pattern. The beam passes through the reticle to curvilinear variable axis collimator lens 100, positioned along axis 101 at a distance from the reticle nearly equal to its focal length and which produces an image of the reticle at or near infinity so that there will be the minimum amount of Coulomb interaction between the electrons in the beam and also to minimize the chromatic effects due to deflection.

The beam is then deflected back toward axis 101 by the combination of deflectors 105, 107 and 205, crossing the axis at aperture 275, while a set of axis compensation yokes 150-1 to 150-n located inside lens 100 and distributed along the beam path in the axial direction (parallel to axis 101) shifts the variable axis so as to be coincident with the central beam trajectory along its entire length thereby establishing a curvilinear field axis. Illustratively, yokes 150 are placed between deflection yokes 105 and 107 and the magnetic pole pieces of lens 100. They are shown displaced in the drawing for ease of illustration. Each of the yokes 150-1 to 150-n is excited with a control current that is proportional to the magnitude of deflection and of a fixed relative ratio to each of the other compensation yokes. This fixed relative ratio is determined from the lens, yoke, and central beam trajectory physical relationships such that the best fit of the desired compensation field is applied, as described below. The use of a fixed ratio is an approximation for convenience and system simplicity. In the most general case, a fit could be made for each subfield of the reticle, with the results stored in the controller means. The current ratios in the coils would then be determined by this stored value. By "fixed" is meant that the ratio does not vary as a function of x and y when using a first order approximation.

After passing through the reticle 375, some of the electrons comprising the illuminating beam will be slightly scattered because they passed through the patterned portion of the reticle. These scattered electrons are absorbed in plate 277 which contains aperture 275 while aperture 275 passes the unscattered electrons in the beam down to the wafer 59 to form the image of the reticle pattern. Reticle 375 may be either a "stencil" reticle, having openings for radiation to pass through, or it may be a "differential" reticle, having areas of relatively low and high scattering cross section, as described in U.S. Pat. No. 5,466,904.

Lens 200, forms a reduced image of the nth subfield of reticle 375 on wafer 59. In this embodiment of the invention, lens 200 is a curvilinear variable axis lens (CVAL) that is not an immersion lens. A curvilinear variable axis immersion lens (CVAIL) having a plurality of axis-shifting coils and a plate similar to plate 14 of FIG. 4 could be used if the system designer preferred. Those skilled in the art will readily appreciate that the use of an immersion lens results in a strong field at the wafer surface, while making it difficult to satisfy the doublet condition between lenses 100 and 200 referred to below; and that the use of a non-immersion lens results in a smaller fringe field at the wafer surface and permits easier satisfaction of the doublet condition. System designers will select one or another system configuration depending on the usual design tradeoff considerations. At the bottom of the figure, box 17' represents schematically the associated wafer support, positioning mechanism, and the like shown in FIG. 4. Illustratively, the reduction ratio has a conventional magnitude in the range between 3:1 to 5:1. This demagnification ratio is achieved by the combination of lenses 200 and 100 which form a doublet pair as described in U.S. Pat. No. 5,466,904.

Deflectors 205 and 207 guide the beam through aperture 275 and on to the nth subfield position on wafer 59, also performing "stitching" when required to correct for a finite separation of the subfields on reticle 375 by shifting the images so that they are contiguous. The invention may be used with reticles that have both contiguous or non-contiguous subfields. The axis-shifting coils for lens 200 are illustrated as boxes 250-1 to 250-n and function to position the variable axis of lens 200 according to the invention as described below.

Figure 3:
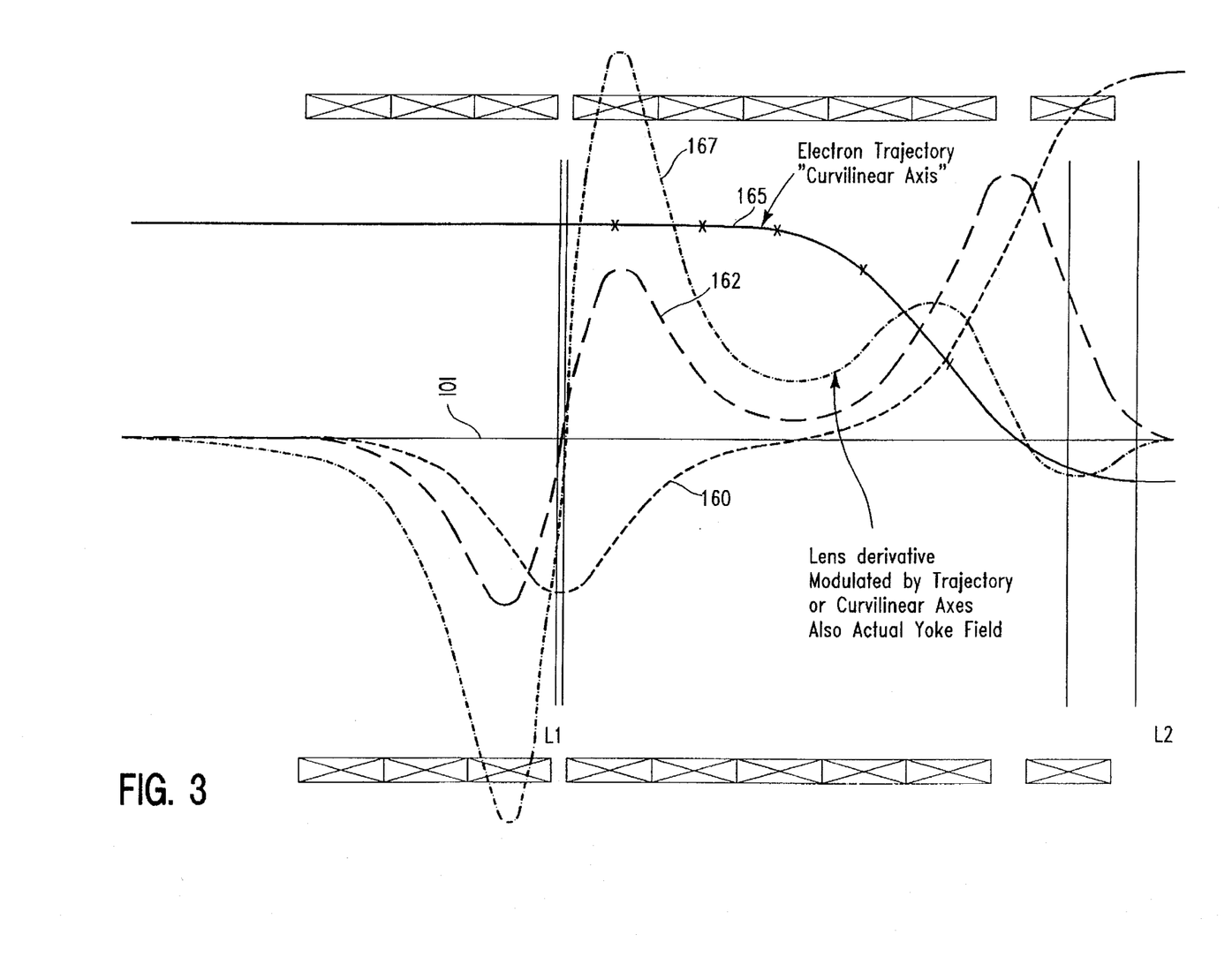
FIG. 3 is a schematic cross-sectional view of the electron optical lens similar to FIG. 2 showing an added dashed line representing the lens derivative modulated by a trajectory or curvilinear axis and an added solid line which is an example of a typical trajectory that may be of interest in an optical system.

Referring now to FIG. 3, line 160 represents the axial flux density of a doublet lens system. For generality, the lens system illustrated is not necessarily the one used in FIF. 1. The boxes at the sides of the figure represent correction coils that shift the axis. No particular number of correction coils is required and the correction coils are not necessarily limited in the z-direction by the lens pole pieces. They may extend a coil length along the system axis 101 that may be greater than, equal to, or less than a lens length between the pole pieces. A first lens L1, not shown in the Figure, is centered at the mark L1 and a second lens L2, also not shown in the Figure, is centered at a corresponding mark on the right of the drawing, showing the effect of its fringing fields. The magnitude of the flux peaks midway between the positions of the pole pieces and tapers off above and below. The dashed line 162 is the first derivative of the axial flux with respect to z. To use this lens as a variable curvilinear axis lens system according to the invention, a planar field that is uniform within any plane perpendicular to the z-axis and that varies in magnitude along the z-axis, proportional to the dashed curve, is applied to the lens field.

FIG. 3 also shows an added solid line 165 that is an example of the radial position of a typical trajectory that may be of interest in an optical system. There could be any number of trajectories used as an example. This trajectory represents the central ray of a deflected electron beam used in a projection lithography system. The x's on the trajectory are located at the central point of the corresponding coils. As can be seen by its relationship to the lens field (line 160), a straight shifted axis parallel to the z-axis would at best be at the same distance from the axis at only a very small portion of its length or even at only one point. However, by modulating the first derivative of the lens (the dashed line) by the trajectory or R(z), the distance from the z-axis, a new function Y(z) of curve 167 is obtained (the dash-dot-dashed line 167). This function Y(z) replaces the first term of Equation (2) as follows:

$$Y(r,z) = -\left(\frac{R(z)}{2}\right)\frac{d}{dz}B(z) \quad (3)$$

This is a function of z and determines the magnitude of the field to be superimposed on the lens field as a function of z. As before, this field is achieved with typical deflection yokes (either of the saddle type or toroidal wound type). The terms deflection yoke or coil and compensation yoke or coil are used interchangeably here because the coils implemented to apply a field in any x-y plane can be used for deflection and/or axis shifting by means of superposition of the fields using the appropriate control signals applied to each axis of a single coil.

The function Y(z) is the curvilinear axis yoke field to be applied to the lens in order to curve the axis of the lens to follow the beam path through the lens, thus forming a curvilinear axis lens. Any of the higher order terms could also be applied if accuracy requirements dictated, forming additive functions in z containing higher powers of R(z), $R(z)^3$, $R(z)^5$, etc. Typically, however, only the first order term is applied for simplicity and because it is by far the dominant term. Generally, each successive term is two orders of magnitude smaller than the preceding term for magnetic lenses of the type used in the illustrative projection system. Line 167 in FIG. 3 shows an actual yoke field that can be practically achieved for this example. The particular associated line 165 was selected as an example to show that when the trajectory passes through the system axis, curve 167 is forced to zero, even though the derivative 162 (used in the prior art) is quite large at this point.

It can be seen in FIG. 3 that the boxes representing coils are touching. As applied to an actual system, the term "adjacent" will be taken to mean close together or nearly touching, since coils are not simple boxes that can be butted together. It can also be seen that there are two gaps in the line of coils where line 167 passes through zero. When the magnitude of the compensation field is small (at such points) there is very little effect on the accumulated error of a beam by omitting the compensation field. In general, it would be possible to reduce costs in a particular application by placing coils only where the magnitude of the counterpart curve to line 167 is large enough to justify compensation. Such a distribution will be referred to as "nonuniform" for purposes of this application. System designers will readily be able to calculate the number and spacing of coils required to reduce errors in a particular application so that the position of the coils generally coincides with peaks in curve 167.

In a magnetic lens, the image is rotated as it passes through the lens, as is illustrated in FIG. 1. This rotation complicates the normal imaging process of the lens. In addition, in a fixed-axis lens, the image of the deflection field will rotate about the fixed axis. This requires calculation of the effect of the rotation and corresponding adjustment to the deflection field applied to produce a desired result.

When a curvilinear axis is applied to the beam deflection, according to the invention, no rotation of the deflection field about the system axis occurs; though the image or beam still rotates about the curvilinear axis. Thus, if an electron beam formed an image at the image plane and the beam was on the axis of the lens, it would be rotated by some amount relative to the object plane. If this beam was then deflected with a curvilinear axis, the image would still be rotated at the image plane, but the entire curvilinear axis would lie in a plane that also contains the z-axis and the deflected central ray of the beam.

The fact that the variable axis of the lens follows the central ray of the beam makes application of the deflection fields and the curvilinear axis yoke fields straight forward, since the curvilinear axis lies in a vertical plane, and the deflection field and the variable axis-shifting field are mutually orthogonal. In the case where the beam travels in the x-z plane, for example, the variable axis correction field will be parallel to the X axis and the deflection will be parallel to the Y axis. The deflection field is applied to one axis of a yoke, and the curvilinear correction is applied to the other (yokes conventionally have coils that apply a field in two orthogonal directions in the x-y plane). In general, the deflection may be in a plane other than those containing the two field axes of the yoke. Thus the fields and therefore the currents to energize each axis of the yoke must be coupled according to the sine and cosine of the azimuthal angle of the deflected beam relative to the yoke axes.

The function R(z) is determined by calculating the electron trajectory for a given deflection yoke arrangement, as is known in the art. It is not even necessary to include the lens field in this calculation since the central ray of the deflected beam is unaffected by the lens in a curvilinear axis lens. The lens axial field and its derivative is usually found by computer simulation of the lens. The curvilinear axis function Y(z) of line 167 can then be derived by multiplying the derivative of the lens field by R(z). This function would then be scaled proportional to the magnitude of the deflection currents in each axis of the deflection yoke, and then the curvilinear axis correction currents would be applied to the orthogonal axes of the deflection yoke or, alternatively, to separate correction yokes.

In the example of FIG. 1, separate deflection yokes 205 and 207 and axis compensation yokes 250-1 to 250-n were shown for maximum clarity. A more compact arrangement can be effected by using single set of yokes to provide both axis compensation and deflection. In that case, the computer for the control means calculates the combined current to be applied to both the X-coils and the Y-coils in each of yokes 250-1 to 250-n to produce the required net field.

This arrangement of a plurality of yokes distributed along the z-axis has the further advantage that a smaller current in each of a number of distributed coils will produce the same deflection as a larger current in a single coil or a few coils, so that the current can be reduced and/or the number of turns (and inductance) can be reduced, in order that the speed of the deflection response will be greater. In addition, the use of a number of smaller distributed deflection yokes permits a better approximation to the curve representing the compensation field. In a particular example, a lens designed for a 100 keV electron system had a total length along the z-axis of 600 mm and used 13 axis-shifting coils.

Those skilled in the art will appreciate that electrostatic means can be used to produce the same result as magnetic means in many circumstances albeit with more difficulty, and the terms deflectors, compensation beam and the like are intended to include electrostatic deflection systems as well as magnetic ones.

While the invention has been described in terms of a single preferred embodiment, those skilled in the art will recognize that the invention can be practiced with modification within the spirit and scope of the appended claims.

Having thus described my invention, what I claim as new and desire to secure by Letters Patent is as follows:

1. A curvilinear axis correction system for particle optical lenses comprising:

a lens having field generating means disposed about a system axis and extending a lens length along said system axis for producing a focussing field to focus a particle beam; and axis-shifting means for producing a set of compensation fields within said lens, each of said set of compensation fields being substantially uniform in a plane perpendicular to said system axis and which set of compensation fields varies in magnitude as a function of position along said system axis, said function of position being dependent on a trajectory of a central ray of said particle beam and each of said set of compensation fields having a magnitude sufficient to cancel a radial component of said focussing field, whereby a variable axis of said focussing field is substantially coincident with said trajectory of a central ray of said particle beam.

2. A system according to claim 1, in which said set of more than two coils are spaced substantially uniformly along said system axis.

3. A system according to claim 1, in which said set of more than two coils are spaced substantially non-uniformly along said system axis.

4. A system according to claim 1, in which said set of coils within said axis-shifting means extend a coil length along said system axis, said coil length being greater than said lens length.

5. A system according to claim 1, in which said set of axis-shifting means includes a set of more than two coils for generating said set of compensation fields within said lens.

6. A system according to claim 5, in which said set of more than two coils are spaced substantially uniformly along said system axis.

7. A system according to claim 5, in which said set of more than two coils are spaced substantially non-uniformly along said system axis.

8. A system according to claim 5, in which said set of coils within said axis-shifting means extend a coil length along said system axis, said coil length being greater than said lens length.

9. A curvilinear axis correction system according to claim 5, in which said lens is a magnetic immersion lens, said immersion lens including an upper pole piece having a predetermined bore, a lower pole piece having a non-zero bore section and a zero bore section, said compensation means producing a magnetic compensation field between said upper and lower pole pieces.

10. Curvilinear axis correction system according to claim 5, in which said lens has an upper pole piece having a predetermined upper bore and a lower pole piece having a predetermined lower bore, thereby permitting the passage said beam.

11. A curvilinear axis correction system according to claim 1, in which said lens is a magnetic immersion lens, said immersion lens including an upper pole piece having a predetermined bore, a lower pole piece having a non-zero bore section and a zero bore section, said compensation means producing a magnetic compensation field between said upper and lower pole pieces.

12. A curvilinear axis correction system according to claim 1, in which said lens has an upper pole piece having a predetermined upper bore and a lower pole piece having a predetermined lower bore, thereby permitting the passage said beam.

13. A particle beam system having a system axis and comprising:

beam generating means for generating a beam of particles and directing said beam along said system axis;

deflection means disposed about said system axis for deflecting said beam in a plane containing said system axis;

a set of lenses for generating a magnetic field to focus said beam on a target, said lenses having field generating means disposed about said system axis and extending a lens length along said system axis for producing a focussing field to focus said beam;

a set of axis-shifting means, disposed within at least one of said set of lenses, for shifting a variable axis of said lens by generating a set of compensation fields within said lens, each of said set of compensation fields being substantially uniform in a plane perpendicular to said system axis and which set of compensation fields varies in magnitude as a function of position along said system axis, said function of position being dependent on a trajectory of a central ray of said beam and each of said set of compensation fields having a magnitude sufficient to cancel a radial component of said focussing field, whereby a field axis of said focussing field is substantially coincident with said trajectory of a central ray of said beam; and control means for applying electrical signals to said deflection means, said compensation means and to said at least one lens.

14. A system according to claim 13, in which said control means includes means for generating a set of axis-shifting signals and a set of deflection signals and for applying both said axis-shifting signals and deflection signals to first and second subsets of coils within at least one member of said set of axis-shifting means in at least one member of said set of lenses, whereby said at least one member of said set of axis-shifting means and said deflection means both use said first and second subsets of coils to shift said variable axis and to deflect said beam.

15. A system according to claim 14, further including means for supporting a reticle carrying a reticle pattern;

upstream deflection and upstream lens means disposed between said beam generating means and said means for supporting a reticle for displacing said beam from said system axis and illuminating a portion of said reticle with said beam;

a downstream aperture plate containing an aperture centered on said system axis;

a first downstream lens, disposed between said means for supporting a reticle and said downstream aperture plate, in which said deflection signals applied to said first and second subsets of coils within said first downstream lens directs said beam through said aperture while said variable axis of said lens shifts therein to follow said trajectory of said beam in response to said axis-shifting signals from said control means applied to said first and second subsets of coils; and a second downstream lens disposed between said downstream aperture plate and said target, in which said deflection signals applied to said first and second subsets of coils within said second downstream lens directs said beam on to said target while said variable axis of said lens shifts therein to follow said trajectory of said beam in response to said axis-shifting signals from said control means applied to said first and second subsets of coils.

16. A system according to claim 13, further including means for supporting a reticle carrying a reticle pattern;

upstream deflection and upstream lens means disposed between said beam generating means and said means for supporting a reticle for displacing said beam from said system axis and illuminating a portion of said reticle with said beam;

a downstream aperture plate containing an aperture centered on said system axis;

a first downstream lens disposed between said means for supporting a reticle and said downstream aperture plate; and a second downstream lens disposed between said downstream aperture plate and said target, said first and second downstream lenses having said axis-shifting means for shifting said variable axis of said lens therein to follow said trajectory and means for deflecting said beam through said aperture.

* * * * *